US 6,738,404 B1

(12) United States Patent
Berger et al.

(10) Patent No.: US 6,738,404 B1
(45) Date of Patent: May 18, 2004

(54) METHOD FOR CONTROLLING A UNIPOLAR SEMICONDUCTOR LASER

(75) Inventors: Vincent Berger, Paris (FR); Carlo Sirtori, Paris (FR)

(73) Assignee: Thomson-CSF, Paris (FR)

( * ) Notice: Subject to any disclaimer, the term of this patent is extended or adjusted under 35 U.S.C. 154(b) by 0 days.

(21) Appl. No.: 09/581,169

(22) PCT Filed: Oct. 12, 1999

(86) PCT No.: PCT/FR99/02457

§ 371 (c)(1),
(2), (4) Date: Jun. 13, 2000

(87) PCT Pub. No.: WO00/22704

PCT Pub. Date: Apr. 20, 2000

(30) Foreign Application Priority Data

Oct. 13, 1998 (FR) .............................. 98 12812

(51) Int. Cl.$^7$ ................................. H01S 5/00
(52) U.S. Cl. ............... 372/45; 372/43; 372/44; 372/69; 372/72; 372/75
(58) Field of Search .................. 372/43, 44, 45, 372/69, 72, 75

(56) References Cited

U.S. PATENT DOCUMENTS

| 5,166,946 A | * | 11/1992 | Caldwell ..................... 372/50 |
| 5,563,902 A | * | 10/1996 | Xu et al. ...................... 372/50 |
| 5,633,512 A | * | 5/1997 | Okuda et al. ................. 257/20 |
| 5,684,817 A | | 11/1997 | Houdre et al. |
| 5,739,949 A | | 4/1998 | Rosencher et al. |
| 5,969,375 A | | 10/1999 | Rosencher et al. |
| 5,995,529 A | * | 11/1999 | Kurtz et al. .................. 372/45 |

* cited by examiner

Primary Examiner—Paul Ip
Assistant Examiner—Cornelius H Jackson
(74) Attorney, Agent, or Firm—Oblon, Spivak, McClelland, Maier & Neustadt, P.C.

(57) ABSTRACT

A method of controlling a unipolar semiconductor laser in the 4–12 μm mid-infrared range. This is an optical control method, unlike a purely electrical, power control method which injects a relatively large flux of electrons. The optical control method may advantageously include two optical beams of the same wavelength and a device for making those beams interfere in the active layer of the laser, the optical control beams having a much shorter wavelength than the wavelength of the unipolar laser and having a frequency capable of being modulated more rapidly than that of the laser.

8 Claims, 6 Drawing Sheets

METHOD FOR CONTROLLING A UNIPOLAR SEMICONDUCTOR LASER

BACKGROUND OF THE INVENTION

1. Field of the Invention

The field of the invention is that of unipolar semiconductor lasers, particularly that useful for generating wavelengths in the 4–12 μm mid-infrared range.

2. Discussion of the Background

The operation of this type of laser is illustrated in FIG. 1. Such a unipolar laser is produced from a stack of layers of semiconductor materials, of calibrated thickness so as to produce quantum-well structures having discrete energy levels. This type of laser has already been described in the literature, and especially in the following references: F. Capasso, A. Y. Cho, J. Faist, A. L. Hutchinson, S. Luryi, C. Sirtori and D. L. Sivco "Unipolar semiconductor laser" EP 95 302112.8. J. Faist, F. Capasso, D. L. Sivco, C. Sirtori, A. L. Hutchinson and A. Y. Cho, Quantum cascade laser, Science, vol. 264, p. 553, J. Faist, F. Capasso, C. Sirtori, D. L. Sivco, J. N. Baillarjeon, A. L. Hutchinson, S. N. G. Chu and A. Y. Cho "High power mid-infrared ($\lambda \simeq 5$ μm) quantum cascade laser operating above room temperature", Appl. Phys. Lett., vol. 68, p. 3680. C. Sirtori, J. Faist, F. Capasso, D. L. Sivco, A. L. Hutchinson and A. Y. Cho, "Quantum cascade laser with plasmon enhanced waveguide operating at 8–4 μm wavelength", Appl. Phys. Lett., vol. 66, p. 3242. Unipolar lasers, which are generally cascaded lasers, involve transitions between discrete energy levels within the conduction band, that is to say for example between the levels $E_1$ and $E_2$ illustrated in FIG. 1. When a flux of electrons is injected into the structure, during the transition of the electrons from the energy level $E_2$ to the energy level $E_1$ there is an emission of photons $h\nu=E_2-E_1$. The energy levels involved in this type of structure thus generate wavelengths in the mid-infrared, which is difficult to obtain using other more conventional methods.

At the present time, in order to achieve power control, or even amplitude modulation, in such lasers, a purely electrical control method is used which consists in injecting a relatively large flux of electrons into the said laser.

In electrical modulation, it can be difficult to obtain very high modulation rates. The power supplies able to rapidly switch the high currents for supplying these lasers are in fact "top-of-the-range" power supplies.

SUMMARY OF THE INVENTION

This is why the invention proposes an optical method of controlling a unipolar laser. This method uses optical control beams of much shorter wavelength than the wavelength of the unipolar laser and therefore of a frequency that can be modulated very rapidly.

More specifically, the subject of the invention is a method of controlling a unipolar semiconductor laser comprising a stack of semiconductor layers so as to create a quantum-well structure having, in at least one of the semiconductor layers called an active layer, at least a first discrete energy level $E_1$ and a second discrete energy level $E_2$ in the conduction band, so as to create an electrically excited laser emission with a photon energy corresponding to the difference in energy levels between the said first energy level and the said second energy level, characterized in that it comprises the optical pumping of the said active layer or of another layer in the stack by optical means emitting at least one control beam at a wavelength, of photon energy greater than or equal to the band gap of the optically pumped layer.

In general, semiconductor lasers are lasers having a large number of optical modes, as shown schematically in FIG. 2. One way of making such lasers monomode consists in creating, within the active layer, a diffraction grating whose period fixes the emission wavelength and therefore the mode. At the present time, the diffraction grating may be obtained by a grating etched into the structure as the article by J. Faist et. al. in Proceedings of the CLEO conference, 1997 illustrates.

This is why the invention advantageously proposes to implement the optical control of the unipolar laser using two optical beams capable of interfering, the optically created diffraction grating making it possible to produce an optically controlled monomode unipolar laser which is easier to fabricate than that requiring etching operations.

More specifically, the subject of the invention is also a method of optically controlling a unipolar semiconductor laser, characterized in that the optical control means comprise two optical beams of the same wavelength and means for making the said beams interfere in the stack of semiconductor layers making up the laser, so as to create an interference fringe grating within the said stack.

According to one embodiment of the invention, the optical control fringe grating may be obtained from a single control laser and from means for recombining the said beams, using conventional interference methods.

BRIEF DESCRIPTION OF THE DRAWINGS

The invention will be more clearly understood and further advantages will appear on reading the description which follows, given by way of non-limiting example and by virtue of the appended figures in which.

DESCRIPTION OF THE PREFERRED EMBODIMENTS

In general, the method of optically controlling a unipolar semiconductor laser comprises a control laser beam acting within the active layer of the quantum structure of the laser or within any layer of the stack of layers of the laser. The wavelength of the control laser beam must be short enough for carriers to be photoinjected above the gap of the semiconductor material forming the layer that it is desired to optically pump in the stack of layers of the unipolar laser.

Figure 1:
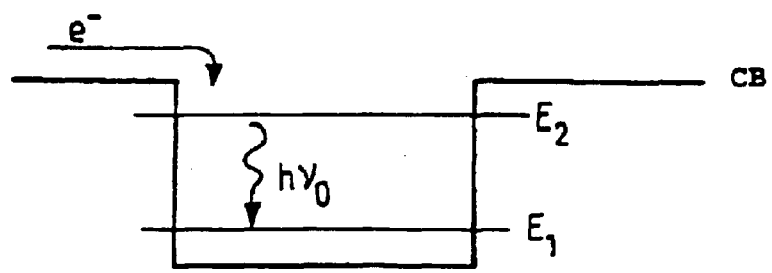
FIG. 1 shows schematically the operation of a unipolar semiconductor laser according to the prior art.
Figure 1:
Figure 2:
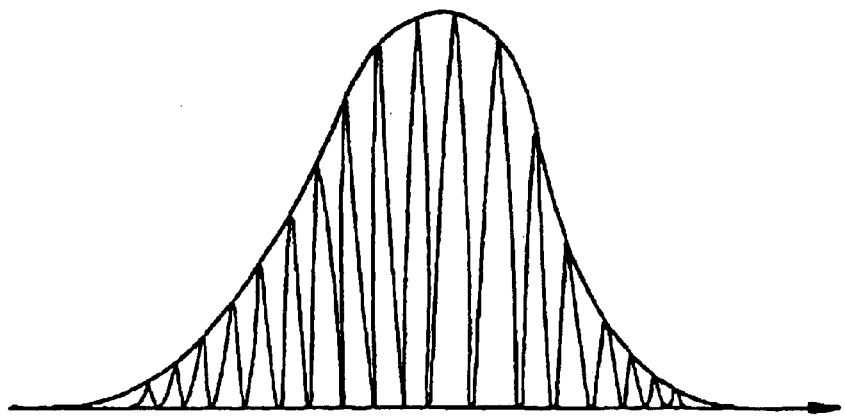
FIG. 2 illustrates the appearance of the optical modes obtained with a conventional semiconductor unipolar laser.
Figure 3:
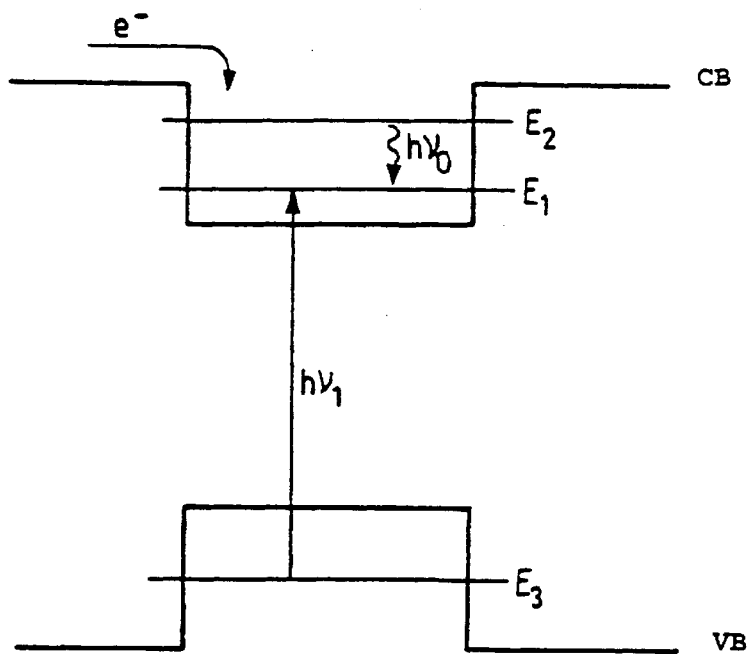
FIG. 3 illustrates a first example of a method of optically controlling a unipolar laser according to the invention.
Figure 4:
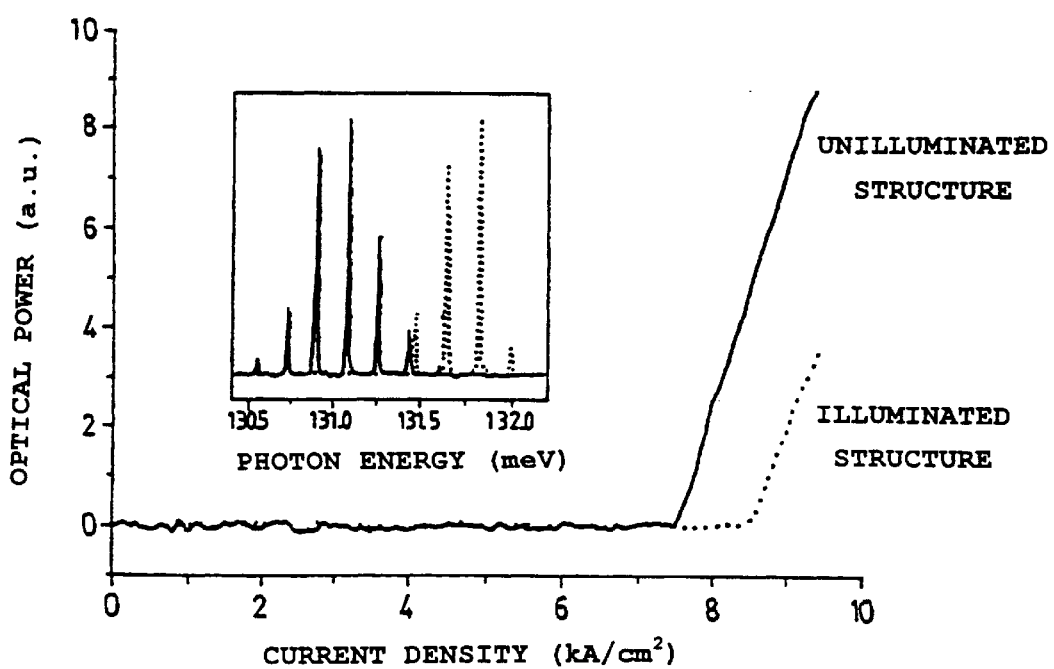
FIG. 4 illustrates the operation of the unipolar laser using the first example of an optical control method described in FIG. 3.

According to a first embodiment of the invention illustrated in FIG. 3, the control laser beam emits at a wavelength $\lambda_1$, associated with a photon energy $h\nu_1$, such that electrons in the valence band VB at an energy level $E_3$ are injected into the conduction band at the energy level $E_1$. By electrically pumping the semiconductor laser, electrons are brought to the energy level $E_2$ and then fall to the lower energy level $E_1$, releasing a photon energy $h\nu_0$ corresponding to the laser emission at the wavelength $\lambda_0$ associated with the frequency $\gamma_0$. Electrons are thus simultaneously brought to the energy level $E_1$ by electrical pumping and optical pumping. This results in a kind of congestion at this energy level and leads to a reduction in the gain of the semiconductor laser. Thus, with this type of optical pumping, it is possible to modulate the gain of the laser, by reducing the said gain. FIG. 4 illustrates this type of operation for a structure through which a current $I_0$ passes, in which the output power of the laser $P_0$ (without illumination) drops to the power $P_i$ (with illumination).

According to another embodiment, the control laser beam generates electron-hole pairs in any layer in the stack of layers of the laser, this layer not necessarily being the active layer. This has the effect of increasing the laser losses in this layer by the absorption of free carriers, and therefore of reducing the resulting gain of the laser. The result is therefore the same as in the first embodiment: by increasing the losses, the net gain of the laser has been reduced, and therefore its threshold has been increased and its operating power, under control illumination, decreased.

Figure 5:
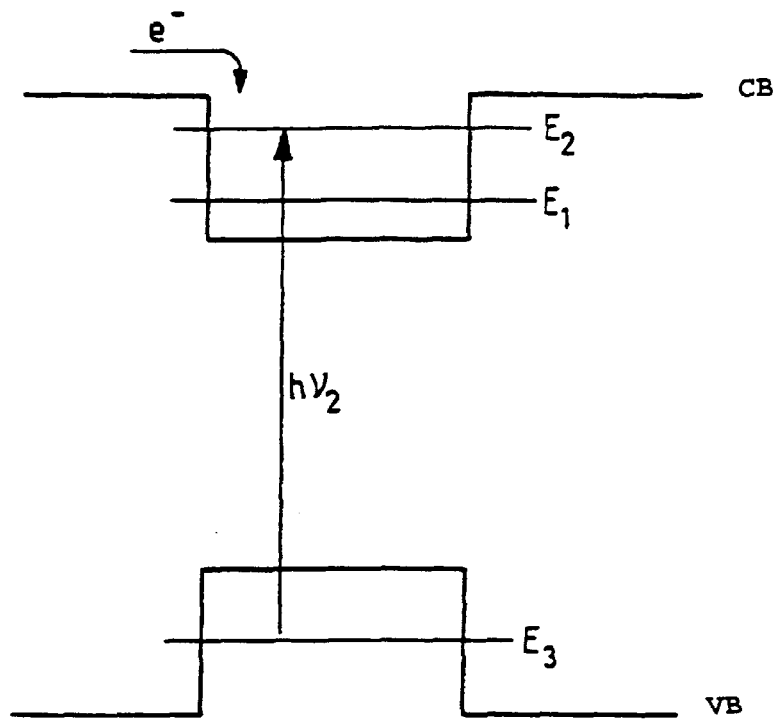
FIG. 5 illustrates a second example of a method of optically controlling a unipolar laser according to the invention.
Figure 6:
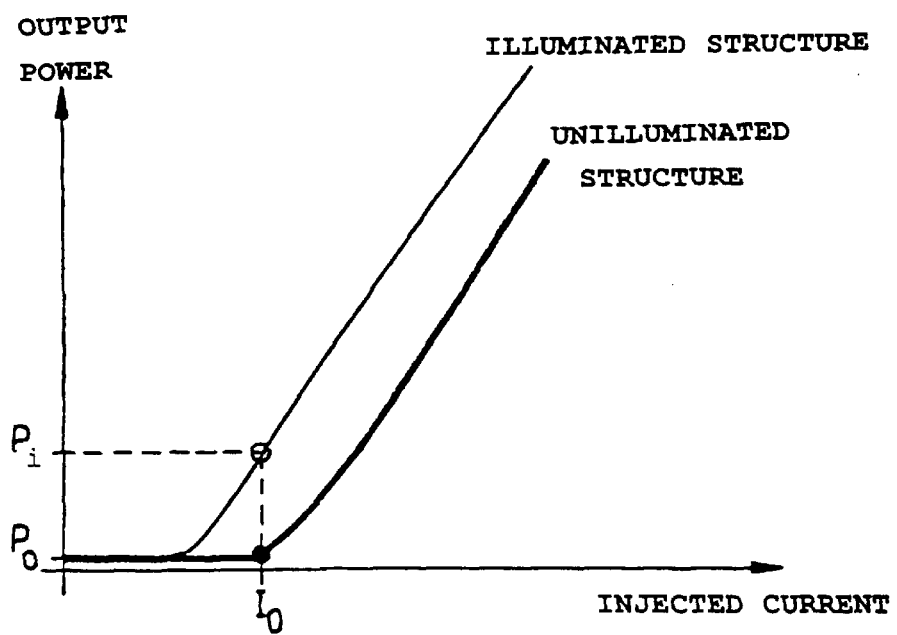
FIG. 6 illustrates the operation of the unipolar laser using the second example of an optical control method described in FIG. 5.

According to a second embodiment of the invention, illustrated in FIG. 5, the control laser beam emits at a wavelength $\gamma_2$, associated with a photon energy $h\nu_2$, such that electrons in the valence band VB at an energy level E3 are injected into the conduction band at the energy level E2. In this configuration, the gain of the laser is amplified since the number of electron transitions from the energy level E2 to the lower energy level $E_1$ is amplified. In this case, the control laser acts as an optical pumping supplement which is added to the optical pumping of the unipolar semiconductor laser. The operation of this laser example is illustrated in FIG. 6. It is especially apparent that, in the particular case in which the unipolar laser is pumped just below its threshold, the supplement provided by the optical pumping allows the laser to operate, the control laser thus acts as an optical switch for the unipolar laser.

We will now describe examples of the control method using a control laser beam. It may be particularly advantageous to effect the optical control using an optical fringe grating to obtain a monomode unipolar laser, the emission wavelength of which may be controlled by the spacing of the optical fringe grating. To do this, light fringes perpendicular to the longitudinal direction of the cavity of the unipolar laser are produced.

In fact, the fringe period d is conventionally given by the following formula:

$$d = \lambda c / 2 \sin c\phi.$$

If $\lambda c$ is the wavelength of the control laser and $\phi$ is the angle between each of the two interfering beams with respect to the normal of the active layer. The wavelength $\lambda u$ emitted by the unipolar laser is then equal to this period d:
$\lambda u = d$.

For example, for a unipolar laser emission at the wavelength $\lambda o = 9$ $\mu$m in vacuo, a refractive index of the active layer of n=3.3 (a conventional value for II-V semiconductor materials) and optical control means emitting two optical beams at the wavelength $\lambda c = 700$ nm, the equation $\lambda u = \lambda o / n = d = \lambda c / 2\sin \phi$ results in defining an angle $\phi = \arcsin(n\lambda c / 2\lambda o)$, which in this case gives $\phi = 7°$ 37, which angle is easy to obtain with conventional interference methods which will be described below.

With this type of control method using illumination fringes, it is possible to produce wavelength-tuneable unipolar sources by changing the period of the illumination fringes. This period may be changed simply by changing the angle between the two beams or else by changing the wavelength of the control laser. This is because it appears that the wavelength of the unipolar laser in vacuo satisfies the following formula:

$$\lambda o = n\lambda c / 2\sin \phi.$$

This assumes the use of a tuneable control laser, this being standard in the submicron wavelength ranges needed for the control laser.

A tuneable unipolar laser is thus obtained, something which is conventionally more difficult to obtain in the mid-infrared wavelength range (a few microns). Such a laser requires neither changing the operating current nor changing the temperature, this being an enormous advantage in terms of the stability of its performance (especially the output power) as a function of the wavelength.

We will now describe a few examples of optical devices making it possible, using a single optical beam emitted by a control laser, to generate the illumination fringes. These devices comprise a means for splitting the optical beam into two optical beams and a means for recombining them using an interference method.

In all situations, the interference fringes are produced so that the spacing of the grating thus created lies in a direction X parallel to the direction in which the unipolar laser emits.

Figure 7:
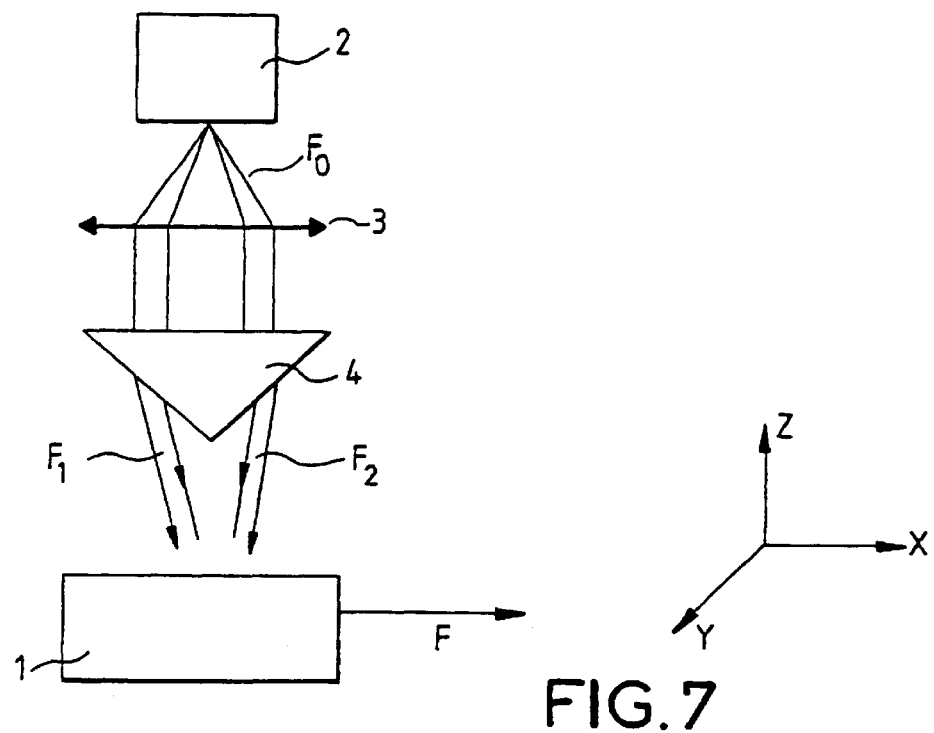
FIG. 7 illustrates a first example of a method according to the invention for rendering a unipolar laser monomode by an optical means.

FIG. 7 illustrates a first example of a method of optically controlling a tuneable unipolar laser. This method uses the illumination of the unipolar laser 1, which emits in the direction X, by two optical beams $F_1$ and $F_2$ coming from a control laser 2 emitting a divergent beam $F_0$ through a lens 3. More specifically, the incident beam $F_0$ passes through a biprism 4 which generates the two interference beams $F_1$ and $F_2$.

Figure 8:
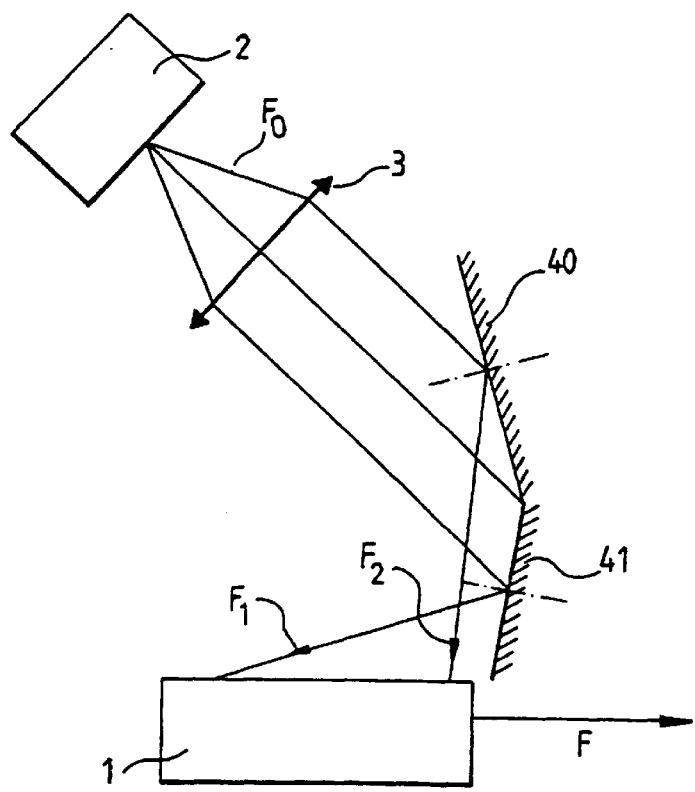
FIG. 8 illustrates a second example of a method according to the invention for rendering a unipolar laser monomode by an optical means.

FIG. 8 illustrates a second example of a method of optically controlling a unipolar laser in which the interference patterns are created with the aid of two Fresnel mirrors 40 and 41, which make an angle between them.

Figure 9:
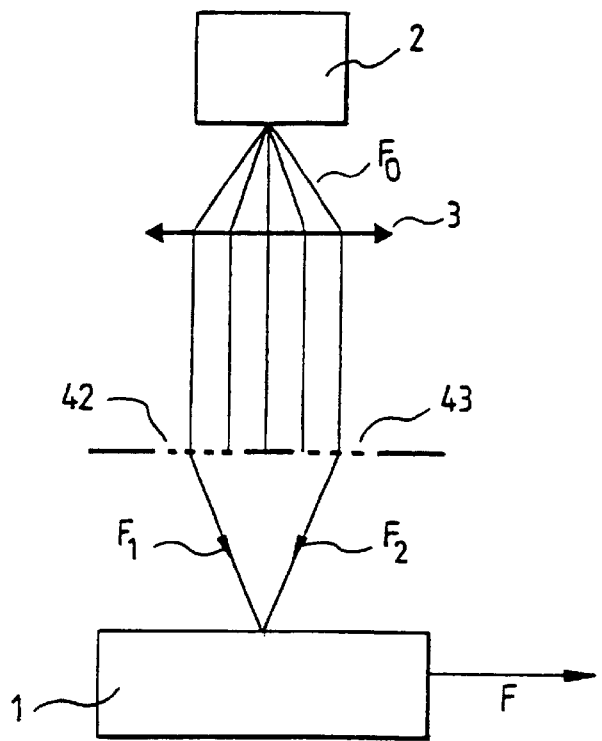
FIG. 9 illustrates a third example of a method according to the invention allowing a unipolar laser to be rendered monomode by an optical means.

FIG. 9 illustrates a third example of a method of optically controlling a unipolar laser in which the interference patterns are created, two diffraction gratings 42 and 43 acting in transmission. These may typically constitute one and the same mask containing, locally, a grating 42 of spacing $d_1$ and, locally, a grating 43 of spacing $d_2$.

Figure 10:
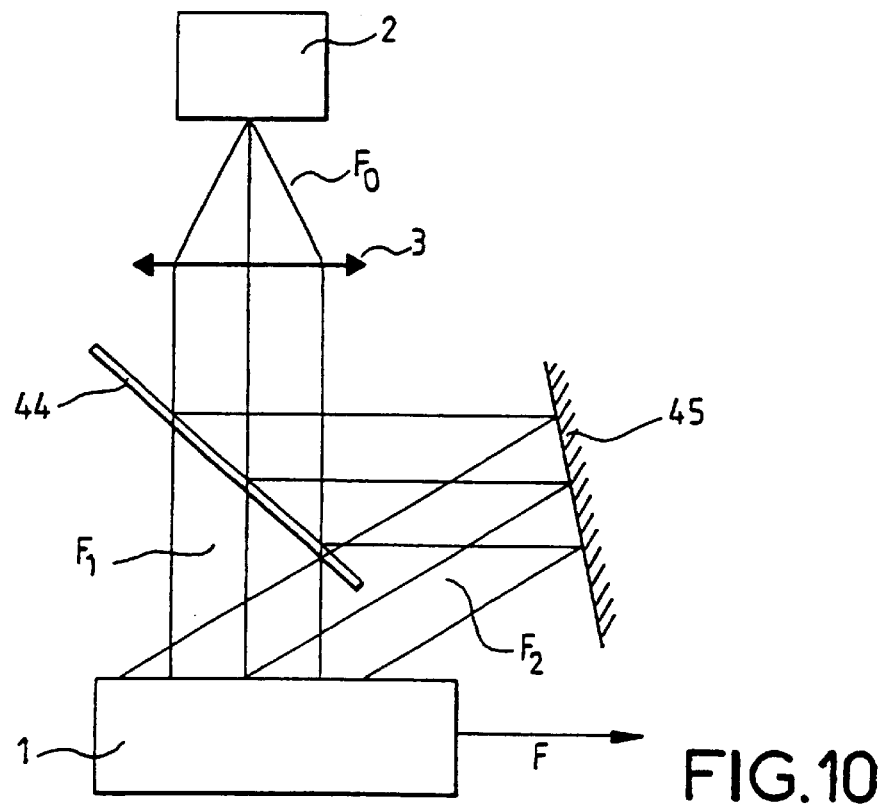
FIG. 10 illustrates a fourth example of a method according to the invention allowing a unipolar laser to be rendered monomode by an optical means.

It is also possible to produce the interference fringes with the aid of a splitter plate 44 and a deflection mirror 45, as illustrated in FIG. 10 in the case of a fourth example of the method.

Figure 11:
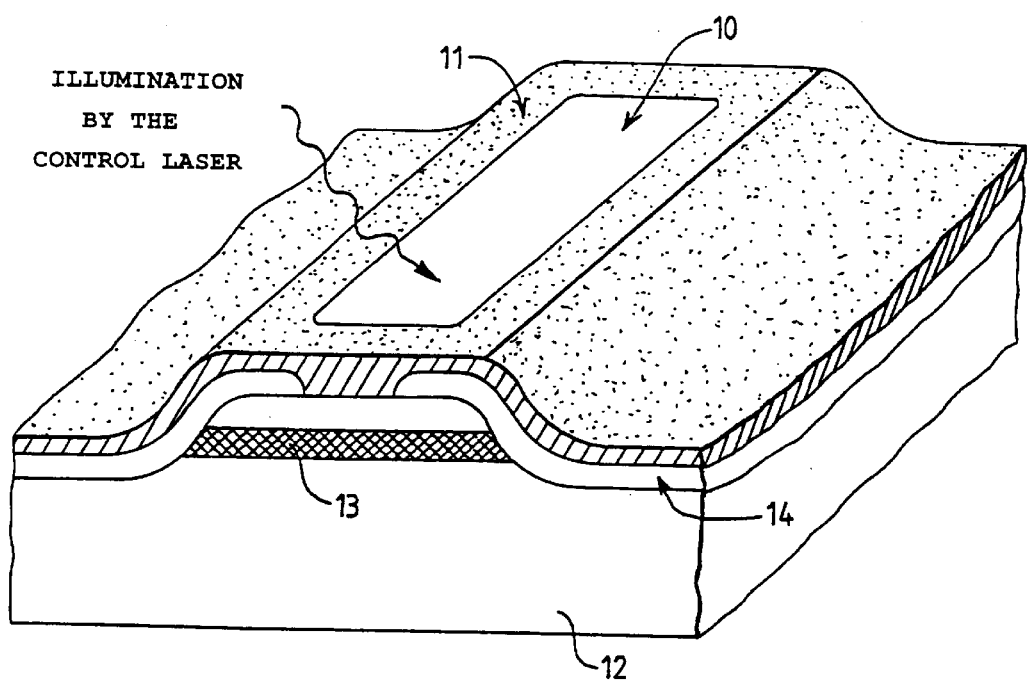
FIG. 11 illustrates a mesa structure of a unipolar semiconductor laser used in the method according to the invention.

In all the examples of the optical control method which have been described above, it is necessary to illuminate the stack of layers of the unipolar laser with the control laser. To do this, it is essential to provide a port within the metal contact layer, always present in a semiconductor layer, which allows the laser to be electrically pumped. FIG. 11 illustrates a semiconductor unipolar laser structure in which the emitted light is confined by virtue of an architecture in the form of a mesa and, within the stack of layers, by virtue of layers of suitable semiconductor materials. The upper, electrical contact layer is removed locally over a width of a few microns approximately. More specifically, FIG. 11 shows an optical aperture 10 in the upper contact layer 11. The active layer 13 is inserted between various stacks of layers, the stacks being deposited on the surface of a substrate 12. A locally etched insulating layer 14 makes it possible to provide transport of electrons locally.

The tables below describe an example of a stack of semiconductor layers that can be used in a control laser according to the invention.

Table 1 refers to all of the layers, Table 2 details the active region and Tables 3, 4 and 5 refer to particular stacks defined so as to obtain the required energy levels.

TABLE 1

| n+ | GaInAs | | | $3 \times 10^{19} cm^{-3}$ | 100 Å |
|---|---|---|---|---|---|
| n+ | GaAs | | | $9 \times 10^{18} cm^{-3}$ | 7000 Å |
| n | $Al_x Ga_{(1-x)}As$ | x = 0.3→0 (top) | | $6 \times 10^{17} cm^{-3}$ | 300 Å |
| n | $Al_{0.75}Ga_{0.25}As$ | | | $6 \times 10^{17} cm^{-3}$ | 10000 Å |
| n | $Al_x Ga_{(1-x)}As$ | x = 0→0.3 (top) | | $6 \times 10^{17} cm^{-3}$ | 300 Å |
| n | GaAs | | | $5 \times 10^{16} cm^{-3}$ | 15500 Å |
| n | $Al_{0.33}Ga_{0.67}As$ | | Table 3 | $4 \times 10^{17} cm^{-3}$ | 220 Å ↑ |
| i | Active region | | Table 3 | | 237 Å  x30 ↓ |
| i | $Al_{0.33}Ga_{0.67}As$ | | Table 4 | | 151 Å |
| n | GaAs | | | $5 \times 10^{16} cm^{-3}$ | 14000 Å |
| n | $Al_{0.33}Ga_{0.67}As$ | (x = 0→0.3) | Table 5 | $6 \times 10^{17} cm^{-3}$ | 300 Å |
| n | $Al_{0.75}Ga_{0.25}As$ | | | $6 \times 10^{17} cm^{-3}$ | 6000 Å |
| n | $Al_{0.33}Ga_{0.67}As$ | (x = 0.3→0) | Table 5 | $6 \times 10^{17} cm^{-3}$ | 300 Å |
| n | GaAs | | | $3 \times 10^{18} cm^{-3}$ | 3000 Å |

GaAs substrate doped $n=2-3 \times 10^{18}$ cm$^{-3}$

TABLE 2

Active Region

| i | AlGaAs (Al % = 33) | 58 Å |
|---|---|---|
| i | GaAs | 15 Å |
| i | AlGaAs (Al % = 33) | 20 Å |
| i | GaAs | 49 Å |
| i | AlGaAs (Al % = 33) | 17 Å |
| i | GaAs | 40 Å |
| i | AlGaAs (Al % = 33) | 34 Å |

TABLE 3

| i | GaAs | 32 Å |
|---|---|---|
| i | AlGaAs (Al % = 33) | 20 Å |
| i | GaAs | 28 Å |
| i | AlGaAs (Al % = 33) | 23 Å |

TABLE 3-continued

| n | GaAs | $4 \times 10^{17} cm^{-3}$ | 23 Å |
|---|---|---|---|
| n | AlGaAs (Al % = 33) | | 25 Å |
| n | GaAs | $4 \times 10^{17} cm^{-3}$ | 23 Å |
| i | AlGaAs (Al % = 33) | | 25 Å |
| i | GaAs | | 21 Å |

TABLE 4

| i | GaAs | 32 Å |
|---|---|---|
| i | AlGaAs (Al % = 33) | 20 Å |
| i | GaAs | 28 Å |
| i | AlGaAs (Al % = 33) | 23 Å |
| i | GaAs | 23 Å |
| i | AlGaAs (Al % = 33) | 25 Å |

TABLE 5

| n | AlGaAs (Al % = 33) | 12 Å |
|---|---|---|
| n | GaAs | 48 Å |
| n | AlGaAs (Al % = 33) | 24 Å |
| n | GaAs | 36 Å |
| n | AlGaAs (Al % = 33) | 36 Å |
| n | GaAs | 24 Å |
| n | AlGaAs (Al % = 33) | 48 Å |
| n | GaAs | 12 Å |
| n | AlGaAs (Al % = 33) | 60 Å |

What is claimed is:

1. Method of controlling a unipolar semiconductor laser, comprising:

injecting electrons, from a metal contact layer into a stack of semiconductor layers configured as a quantum-well structure having an active layer in at least one of the semiconductor layers and having at least a first discrete energy level and a second discrete energy level higher in energy than the first energy level in a conduction band of the active layer, to populate said electrons into the second discrete energy level;

emitting laser emission from said active layer through a transition of said electrons in the second energy level to the first energy level, said emission having a photon energy corresponding to a difference in energy levels between said first energy level and said second energy level; and reducing a gain in said laser emission by pumping optically electrons from a third energy level in a valence band of the active layer of the at least one of the semiconductor layers to said first energy level to populate said first energy level, said pumping optically occurring by at least one control beam having a wavelength of a photon energy greater than or equal to a band gap of the optically pumped semiconductor layer.

2. Method of optically controlling a unipolar semiconductor laser according to claim 1, wherein the step of modulating comprises:

interfering two optical beams of a same wavelength in one of the semiconductor layers by an interference fringe grating in said one of the semiconductor layers.

3. Method of optically controlling a unipolar laser according to claim 2, wherein step of modulating comprises:

interfering within the optically pumped semiconductor layer two laser beams generated by a control laser emitting an incident laser beam and by a biprism generating, from the incident laser beam, the two laser beams.

4. Method of optically controlling a unipolar laser according to claim 2, wherein step of modulating comprises:

interfering within the optically pumped semiconductor layer two laser beams generated by a control laser emitting an incident laser beam and by two transmission diffraction gratings generating, from the incident laser beam, the two laser beams.

5. Method of optically controlling a unipolar laser according to claim 2, wherein step of modulating comprises:

interfering within the optically pumped semiconductor layer two laser beams generated by a control laser emitting an incident laser beam and by two Fresnel mirrors generating, from the incident laser beam, the two laser beams.

6. Method of optically controlling a unipolar laser according to claim 2, wherein step of modulating comprises:

interfering within the optically pumped semiconductor layer two laser beams generated by a control laser emitting an incident laser beam and by a splitter plate and a deflection mirror generating, from the incident laser beam, the two laser beams.

7. Method of optically controlling a unipolar laser according to claim 1, wherein the step of modulating comprises:

illuminating with the control beam the optically pumped semiconductor layer through an aperture in an upper, metallic, electrical contact layer of the optically pumped semiconductor layer.

8. Method of optically controlling a unipolar laser according to claim 7, wherein the step of illuminating comprises:

illuminating a mesa structure of the unipolar laser, said mesa structure having said aperture on a surface of the mesa.

* * * * *